(12) United States Patent
Lee et al.

(10) Patent No.: US 10,916,814 B2
(45) Date of Patent: Feb. 9, 2021

(54) BATTERY PACK DIAGNOSTIC APPARATUS FOR ANALYZING A STATE OF A BATTERY PACK ACCORDING TO VARIOUS MEASUREMENT VALUES

(71) Applicant: Samsung SDI Co., Ltd., Yongin-si (KR)

(72) Inventors: Soojin Lee, Yongin-si (KR); Imsu Choi, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 212 days.

(21) Appl. No.: 16/133,532

(22) Filed: Sep. 17, 2018

(65) Prior Publication Data
US 2019/0089019 A1    Mar. 21, 2019

(30) Foreign Application Priority Data
Sep. 21, 2017  (KR) ........................ 10-2017-0121867

(51) Int. Cl.
*H01M 10/42*       (2006.01)
*H02J 7/00*        (2006.01)
(Continued)

(52) U.S. Cl.
CPC .... *H01M 10/4285* (2013.01); *G01R 31/3648* (2013.01); *G01R 31/371* (2019.01);
(Continued)

(58) Field of Classification Search
CPC ......... H04W 52/0274; H04W 52/0277; H04W 52/028; H04W 12/12; H04W 4/08;
(Continued)

(56) References Cited

U.S. PATENT DOCUMENTS 6,873,135 B2 *   3/2005   Nakatsuji .......... H01M 10/4257
                                                  320/132
7,923,967 B2 *   4/2011   Hamaguchi ........... H02J 7/0047
                                                  320/116
(Continued)

FOREIGN PATENT DOCUMENTS

CN     101667665 A     3/2010
CN     102096048 A     6/2011
(Continued)

OTHER PUBLICATIONS

Extended European Search Report for corresponding European Patent Application No. 18188134.3, dated Apr. 1, 2019, 8 pages.
(Continued)

*Primary Examiner* — Vinh P Nguyen
(74) *Attorney, Agent, or Firm* — Lewis Roca Rothgerber Christie LLP

(57) ABSTRACT

A battery pack diagnostic apparatus includes a communication port, a measurer, and a controller. The communication port provides an electrical connection between the battery pack diagnostic apparatus and a battery management system. The measurer is electrically connected to an output terminal of the battery pack and is configured to measure a voltage and a current of the battery pack. The controller is configured to obtain a first measurement value with respect to a voltage and a current of the battery pack from the battery management system. The controller is further configured to obtain a second measurement value with respect to a second voltage and a second current of the battery pack from the measurer. The controller analyzes a state of the battery pack based on the first measurement value and the second measurement value.

11 Claims, 5 Drawing Sheets

(51) Int. Cl.
*G01R 31/36* (2020.01)
*H01M 10/48* (2006.01)
*G01R 31/371* (2019.01)
*G01R 31/3842* (2019.01)

(52) U.S. Cl.
CPC ...... *G01R 31/3842* (2019.01); *H01M 10/425* (2013.01); *H01M 10/48* (2013.01); *H02J 7/0029* (2013.01); *H02J 7/0047* (2013.01); *H01M 2010/4271* (2013.01)

(58) Field of Classification Search
CPC ....... H04W 84/12; H04W 88/08; H04W 8/02; H04W 8/205; H02J 7/0047; H02J 7/0029; H02J 7/00; H02J 7/0014; H02J 7/007; H02J 50/80; H02J 7/00034; H02J 7/0013; H02J 7/0021; H02J 7/045; H02J 13/00022; H02J 2207/20; H02J 7/00036; H02J 7/00045; H02J 7/0027; H02J 7/00302; H02J 7/0048; H02J 7/008; H04R 1/1016; H04R 1/1025; H04R 1/1041; H04R 1/105; H04R 2201/105; H04R 2201/107; H04R 2420/07; H04R 2420/09; G01D 4/004; G01D 18/00; G01D 21/00; G06F 11/366; G06F 11/30; B60L 2240/547; B60L 2240/549; B60L 3/12; B60L 58/12; B60L 2260/44; B60L 58/16; B60L 3/0046; B60L 53/67; B60L 53/68; B60L 53/80; B60L 58/13; G01R 31/3648; G01R 31/371; G01R 31/3842; G01R 31/66; G01R 31/36; G01R 31/367; G01R 31/392; G01R 31/50; G01R 19/165; G01R 27/02; G01R 31/00; G01R 31/007; G01R 31/28; G01R 31/2834; G01R 31/3333; G01R 31/382; G01R 31/3835; G01R 31/396; H01M 2010/4271; H01M 10/48; H01M 10/425; H01M 10/4285

See application file for complete search history.

(56) References Cited

U.S. PATENT DOCUMENTS

| | | | |
|---|---|---|---|
| 8,976,034 B2 | 3/2015 | Yoo | |
| 9,046,585 B2 * | 6/2015 | Sugeno | G01R 31/3842 |
| 9,506,989 B2 * | 11/2016 | Suzuki | G01R 31/3835 |
| 9,658,293 B2 * | 5/2017 | Kimura | G01R 31/3648 |
| 10,207,596 B2 | 2/2019 | Lin et al. | |
| 10,490,809 B2 | 11/2019 | Noh et al. | |
| 10,541,548 B2 * | 1/2020 | Kim | H02J 7/0026 |
| 2012/0004799 A1 * | 1/2012 | Maeda | B60L 58/15 |
| | | | 701/22 |
| 2013/0138373 A1 | 5/2013 | Lee et al. | |
| 2016/0238667 A1 | 8/2016 | Palmisano et al. | |
| 2017/0047759 A1 | 2/2017 | Kim | |
| 2017/0113565 A1 | 4/2017 | Lin et al. | |

FOREIGN PATENT DOCUMENTS

| | | |
|---|---|---|
| CN | 102508167 A | 6/2012 |
| CN | 106199479 A | 12/2016 |
| CN | 106611884 A | 5/2017 |
| DE | 10 2016 119 166 A1 | 4/2017 |
| EP | 2 641 783 A2 | 9/2013 |
| KR | 10-2013-0055156 A | 5/2013 |
| KR | 10-2013-0055825 A | 5/2013 |
| KR | 10-2014-0068331 A | 6/2014 |
| KR | 10-1468314 B1 | 11/2014 |

OTHER PUBLICATIONS

Chinese Office Action, with English translation, dated Jul. 3, 2020, for corresponding Chinese Patent Application No. 201810958774.3 (16 pages).

* cited by examiner

BATTERY PACK DIAGNOSTIC APPARATUS FOR ANALYZING A STATE OF A BATTERY PACK ACCORDING TO VARIOUS MEASUREMENT VALUES

CROSS-REFERENCE TO RELATED APPLICATION

This application claims priority to and the benefit of Korean Patent Application No. 10-2017-0121867, filed on Sep. 21, 2017, in the Korean Intellectual Property Office, the disclosure of which is incorporated herein in its entirety by reference.

BACKGROUND

1. Field

One or more embodiments relate to a battery pack diagnostic apparatus.

2. Description of the Related Art

With the increasingly active development of electric vehicle and energy storage technologies, the development of battery pack-related technologies has become increasingly important. In particular, technologies for identifying a state of a battery pack for charging, discharging, and management of the battery pack are especially important.

These technologies are generally implemented using dedicated equipment that is usually located in a separate facility. Thus, the diagnosis of a battery pack is inconvenient in that a battery pack is usually separated from a device (e.g., an electric vehicle, an energy storage device, a smart phone, a tablet computer, a laptop, etc.) and transported to a separate facility (e.g., a service center) for analysis (e.g., to determine a reason for abnormalities). This leads to additional issues, such as an increase in service costs, an increase in a period for which a battery is not available for use, etc.

SUMMARY

One or more embodiments include a battery pack diagnostic apparatus, via which a user may quickly and easily identify a state of a battery pack in a site in which the battery pack is installed and/or used, and may correct an error of an output voltage and an output current of the battery pack, the output voltage and the output current being measured by a battery management system included in the battery pack.

Additional aspects will be set forth in part in the description which follows and, in part, will be apparent from the description, or may be learned by practice of the presented embodiments.

According to one or more embodiments, a battery pack diagnostic apparatus for diagnosing a battery pack including a battery and a battery management system includes: a communication port configured to provide an electrical connection between the battery pack diagnostic apparatus and the battery management system; a measurer electrically connected to an output terminal of the battery pack and configured to measure a voltage and a current of the battery pack; and a controller configured to obtain a first measurement value with respect to a first voltage and a first current of the battery pack, the first voltage and the first current being received from the battery management system, obtain a second measurement value with respect to a second voltage and a second current of the battery pack, the second voltage and the second current being measured by the measurer, and to analyze a state of the battery pack based on the first measurement value and the second measurement value.

The controller may further be configured to calculate an error rate of the first measurement value based on the second measurement value, and when the calculated error rate is greater than a reference value (e.g., a preset reference value), output a correction signal to the battery management system via the communication port.

The correction signal may be a signal for correcting an offset value with respect to measurements of voltage and current of the battery management system.

The communication port may include a plurality of terminals for controller area network (CAN) communication and universal asynchronous receiver/transmitter (UART) communication, and the controller may further be configured to analyze a protocol, a voltage level, and noise of the plurality of terminals and to diagnose abnormalities of the plurality of terminals.

The communication port may include a first port providing an electrical connection between the battery pack diagnostic apparatus and the battery management system and a second port for electrically connecting the battery pack diagnostic apparatus and at least one of a protection switch and a notifier, the protection switch and the notifier being provided in the battery pack, and the controller may further be configured to output, via the second port, a control signal for turning off the protection switch and a control signal for operating the notifier.

The controller may further be configured to output via the first port a first control signal to allow the battery management system to turn off the protection switch and output via the second port a second control signal to allow the battery management system to turn off the protection switch and the notifier.

The controller may further be configured to sequentially output the first control signal and the second control signal and diagnose states of the battery management system, the protection switch, and the notifier.

The battery pack diagnostic apparatus may further include a display, which displays state information of the battery pack under control of the controller.

The controller may further be configured to activate the battery pack.

The controller may be further configured to activate the battery pack by generating a wake-up signal for operating the battery pack and outputting the generated wake-up signal through the communication port to operate the battery pack.

The controller may be further configured to communicate diagnostic status information of the battery pack to a mobile device.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1A:
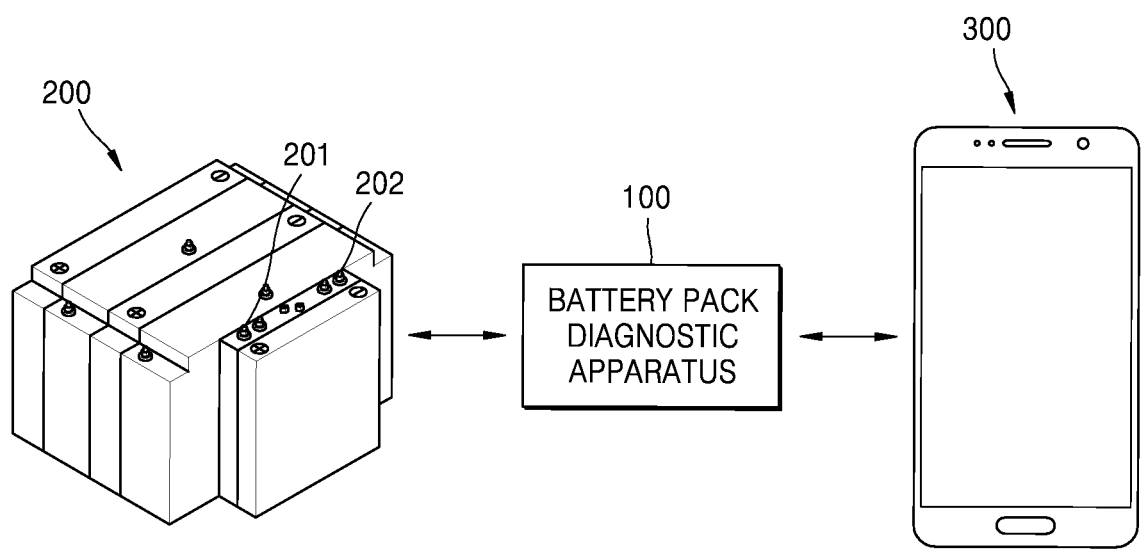
FIGS. 1A and 1B illustrate a structure of a battery pack diagnostic system according to various embodiments.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

For example, specific shapes, structures, and characteristics described in this specification according to an embodiment may be modified according to another embodiment without departing from the spirit and scope of the present disclosure. Also, it will be understood that locations and an arrangement of individual components described with reference to each embodiment may be modified without departing from the spirit and scope of the present disclosure. Thus, the present disclosure should not be construed as limited to the detailed description below, and the present disclosure should be understood to encompass the scope of the claims and all scopes equivalent thereto. Like reference numerals in the drawings refer to like elements throughout. That is, the described details are only examples. Specific embodiments may be modified from these example details, and may be considered to be included in the spirit and cope of the present disclosure.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof. It will be understood that, although the terms first, second, etc. may be used herein to describe various elements, these elements should not be limited by these terms. These terms are only used to distinguish one element from another.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, embodiments of the present disclosure will be described in detail with reference to the accompanying drawings. When the present disclosure is described with reference to the accompanying drawings, like reference numerals refer to like elements, and their descriptions will not be repeated. As used herein, the term "and/or" includes any and all combinations of one or more of the associated listed items. Expressions such as "at least one of," when preceding a list of elements, modify the entire list of elements and do not modify the individual elements of the list.

Figure 1B:
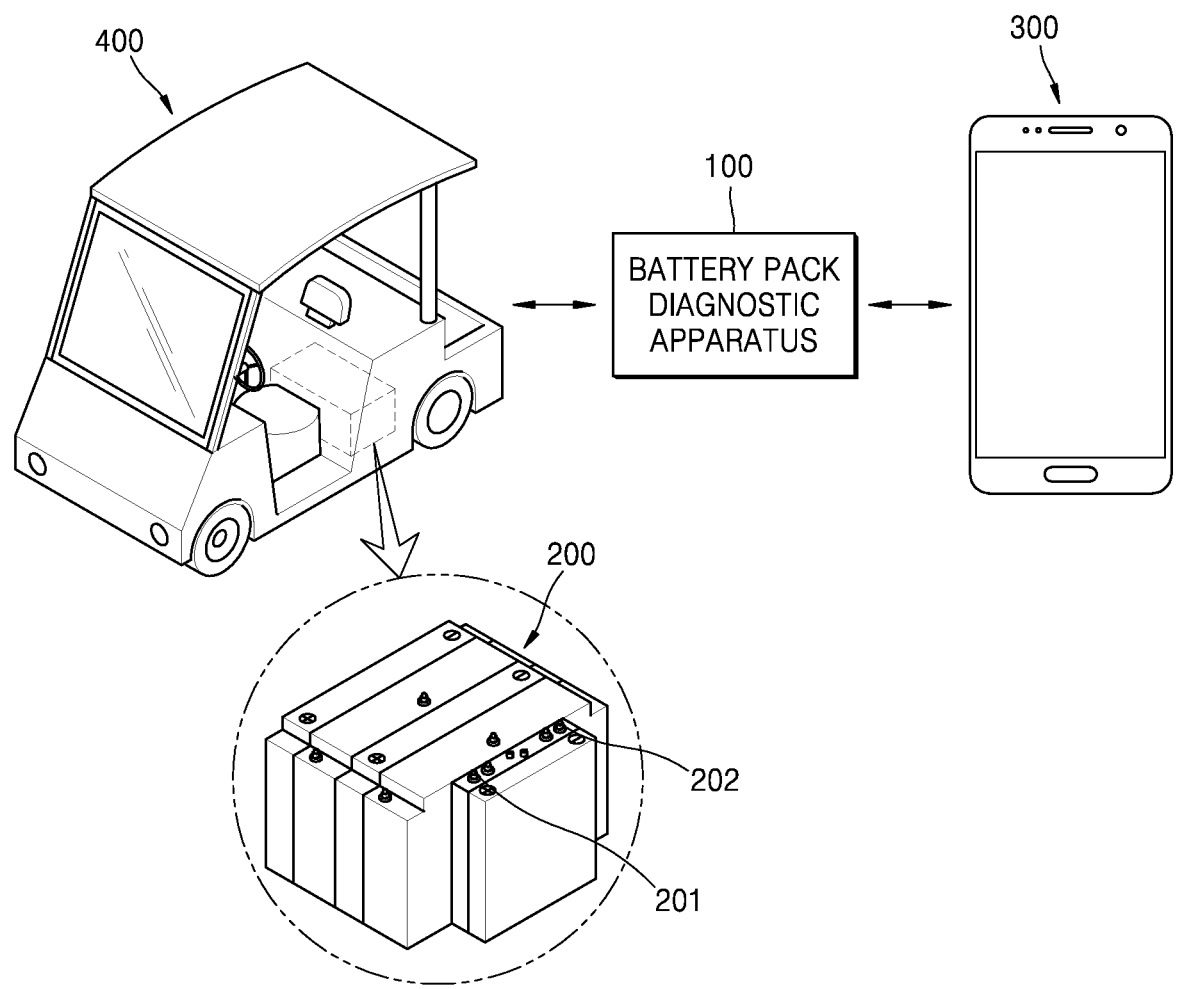

FIGS. 1A and 1B illustrate a structure of a battery pack diagnostic system according to various embodiments.

First, referring to FIG. 1A, a battery pack diagnostic apparatus 100 according to an embodiment may be connected to a battery pack 200. The battery pack diagnostic apparatus 100 and the battery pack 200 may be electrically connected with each other via a cable. However, based on the structure of the battery pack diagnostic apparatus 100 and the battery pack 200, the battery pack diagnostic apparatus 100 and the battery pack 200 may be connected with each other via a wireless communication method. However, these are only examples, and the present disclosure is not limited thereto.

The battery pack diagnostic apparatus 100, according to an embodiment, may transmit and receive data to and from a user terminal 300 such as a mobile device operating an application (e.g., a smart phone, tablet, laptop, etc.). Here, the battery pack diagnostic apparatus 100 may be connected to the user terminal 300 via any suitable wired or wireless communication method known to those skilled in the art.

Next, referring to FIG. 1B, the battery pack diagnostic apparatus 100, according to another embodiment, may be connected to a device 400 in which the battery pack 200 is mounted. In other words, the battery pack diagnostic apparatus 100, according to another embodiment, may be indirectly connected to the battery pack 200 via the device 400. In this embodiment, based on a structure of the battery pack diagnostic apparatus 100 and the device 400, the battery pack diagnostic apparatus 100 and the device 400 may be connected with each other via a wired communication method or a wireless communication method or any suitable combination thereof. Also, as in the embodiment described above, the battery pack diagnostic apparatus 100 may be connected with the user terminal 300 via various wired or wireless communication methods.

According to various embodiments, the device 400 may denote various devices in which the battery pack 200 is mounted. For example, the device 400 may be a transportation device in which the battery pack 200 is mounted as illustrated in FIG. 1B, and may be any one of an electric vehicle, a cart, an electric bicycle, an electric scooter, and/or an electric two-wheeled vehicle. However, these vehicles are provided as an example, and the present disclosure is not limited thereto.

Figure 2:
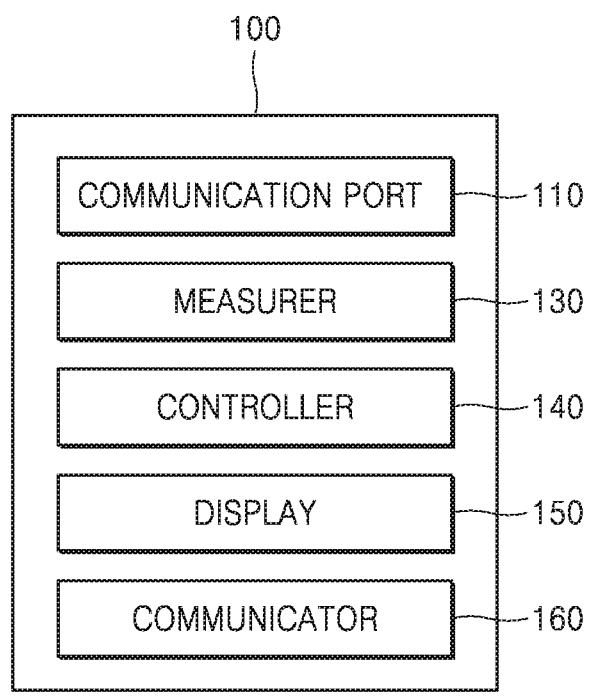
FIG. 2 is a schematic block diagram of an inner structure of a battery pack diagnostic apparatus according to an embodiment.

FIG. 2 is a schematic block diagram of an inner structure of the battery pack diagnostic apparatus 100 according to an embodiment.

Referring to FIG. 2, the battery pack diagnostic apparatus 100 may include a communication port 110, a measurer 130, a controller 140, a display 150, and a communicator 160.

The communicator 160 may configure a communication connection between the battery pack diagnostic apparatus 100 and other devices, and may exchange data with the other devices via the configured communication connection. For example, the communicator 160 may configure a communication connection with the user terminal 300 described above via a second communication method, and may exchange data with the user terminal 300. In this case, the data may include information related to a diagnosis of a state of the battery pack 200 (e.g., diagnostic status information), a control signal with respect to the battery pack diagnostic apparatus 100, etc.

The communicator 160 may perform wireless communication, etc., with other devices, as described above. For example, the communicator 160 may perform wireless communication with the user terminal 300 using any one of a Bluetooth communication method, a Wi-Fi communication method, a Zigbee (Zigbee® is a registered trademark of the Zigbee Alliance Corporation) communication method, and a near-field communication (NFC) method. However, these wireless communication methods are provided as an example, and the present disclosure is not limited thereto.

The communication port 110 may provide an electrical connection between a battery management system included in the battery pack 200 and the controller 140 so that data and/or a control signal may be exchanged between the battery management system and the controller 140. According to example embodiments, the battery management system is an object of diagnosis, and can provide the controller 140 with data about the current state and health of the battery pack 200. The communication port 110 may include a controller area network (CAN) communication terminal for CAN communication, a universal asynchronous receiver/transmitter (UART) communication terminal for UART communication, etc. However, these communications terminals are provided as examples, and the present disclosure is not limited thereto.

The measurer 130 may be electrically connected to the object being diagnosed. For example, the measurer 130 may be electrically connected to a negative terminal 202 and a positive terminal 201 of the battery pack 200. The measurer 130 may include at least one of a voltage sensor for measuring a voltage magnitude or a current sensor for measuring a current magnitude between the two terminals 201 and 202 of the battery pack 200 via the electrical connection. The measurer 130 may transmit a result of the measurement to the controller 140 as a second measurement value.

The controller 140 may include all types of devices for processing data, such as a processor. Here, the processor may denote, for example, a data processing device embedded in hardware and having a physically structured circuit to perform functions indicated by code or commands included in a program. Examples of the data processing device embedded in hardware may include a microprocessor, a central processing unit (CPU), a processor core, a multiprocessor, an application-specific integrated circuit (ASIC), a field programmable gate array (FPGA), etc. However, the present disclosure is not limited thereto.

When the controller 140 is electrically connected to the battery management system, the controller 140 may receive, from the battery management system, information about a state of a voltage and/or a current of the battery pack 200, as analyzed by the battery management system. The controller 140 may determine whether it is necessary to correct an offset value, which is a reference for the measurement of current and voltage of the battery management system. For example, the controller 140 may compare a first measurement value, which is a value of the voltage and the current of the battery pack 200, the value being analyzed by the battery management system, with the second measurement value, the value being analyzed by the measurer 130 and provided to the controller 140. When the controller 140 determines that it is necessary to correct the offset value, the controller 140 may output a correction signal for correcting the offset value to the battery management system.

The controller 140 may diagnose a state of a communication terminal provided in the battery pack 200. For example, the controller 140 may analyze a protocol received from the communication terminal and thereby determine whether the received protocol corresponds to a preset protocol. In another example, the controller 140 may measure a voltage level of the communication terminal and determine whether there is a physical breakdown in the communication terminal, such as shortage, disconnection, etc. The controller 140 may determine whether or not a state of the communication terminal is normal by detecting noise from the communication terminal or analyzing noise margin indicating tolerance with respect to noise.

The display 150 may display various operational information. For example, the display 150 may display at least one of an operation state of the battery pack diagnostic apparatus 100, a state of the CAN communication between the battery pack diagnostic apparatus 100 and the battery pack 200, a state of communication between the battery pack diagnostic apparatus 100 and the user terminal 300 based on a wireless communication method, and the state information of the battery pack 200.

In this case, the display 150 may include a display device for displaying the information described above as text or a figure. Here, the display device may be, for example, any one of a cathode ray tube (CRT), a liquid-crystal display (LCD), a plasma display panel (PDP), a MicroLED, and an organic light-emitting diode (OLED) display.

The display 150 may include a display device for displaying the information described above as a color or a frequency of flickering. In this case, the display device may include, for example, a plurality of light-emitting diodes (LEDs).

The information displayed by the display 150 may be generated by the controller 140 based on the operation state of the battery pack diagnostic apparatus 100 or may be obtained by the controller 140 from the battery pack 200 or obtained via the user terminal 300. For example, the display 150 may display information about a breakdown or an abnormality of the communication terminal, an abnormality of the battery management system of the battery pack 200, etc., as determined by the controller 140.

Figure 3:
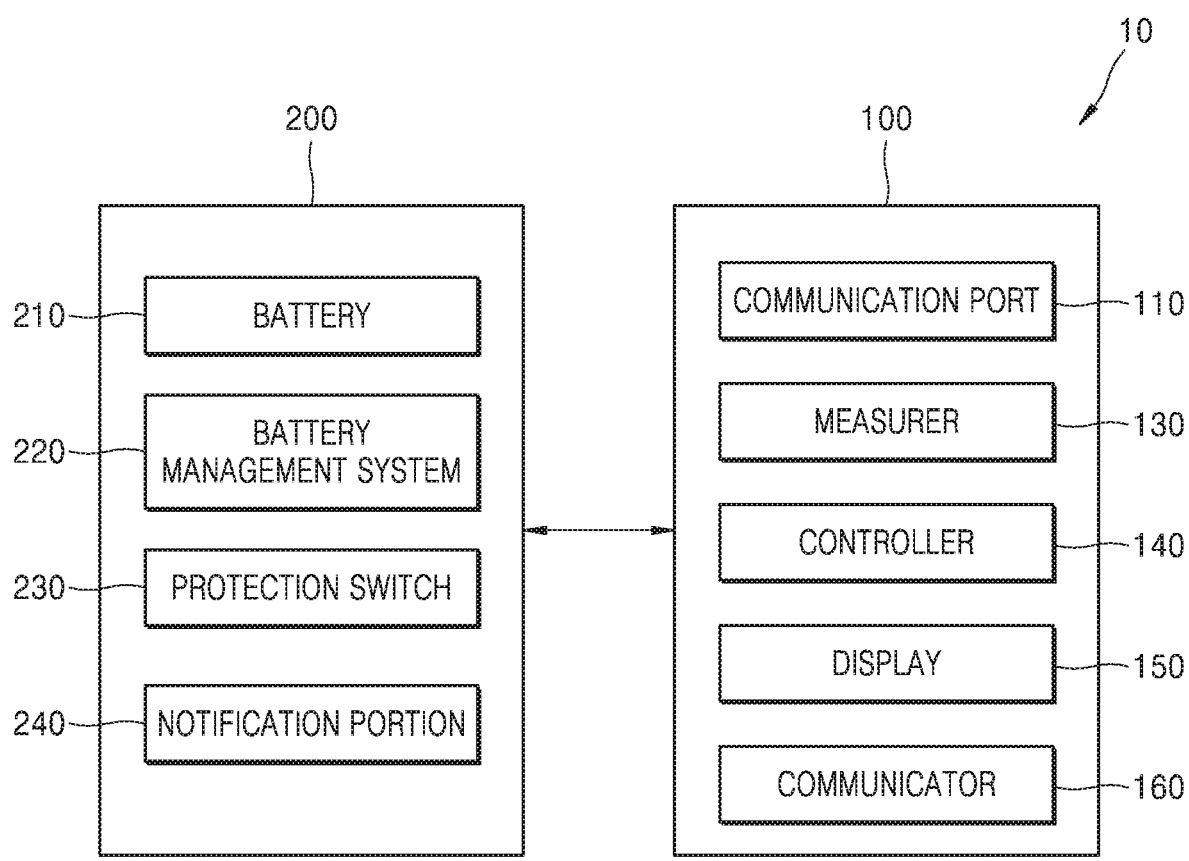
FIG. 3 schematically illustrates a structure of a battery pack diagnostic system according to an embodiment.

FIG. 3 briefly illustrates a structure of a battery pack diagnostic system 10 according to an embodiment.

The battery pack diagnostic system 10 may include the battery pack 200 and the battery pack diagnostic apparatus 100. The battery pack 200 may include a battery 210, a battery management system 220, a protection switch 230, and a notifier 240. The battery pack diagnostic apparatus 100 may include the communication port 110, the measurer 130, the communicator 160, the controller 140, and the display 150.

The battery 210 is a unit configured to store power and may include at least one battery cell (not shown). The battery 210 may include one battery cell or a plurality of battery cells. The battery cells may be connected in series, in parallel, or both in series and parallel. The number of the battery cells included in the battery 210, or methods of connection of the battery cells may be determined based on a required output voltage Vo and a power storage capacity. Meanwhile, a voltage and a current of the battery 210 may have a value corresponding to a value of an output voltage and an output current of the battery pack 200.

According to example embodiments, the battery cell may include a secondary battery that is rechargeable (except for in cases where the secondary battery is a primary battery such as a lead storage battery). For example, the battery cell may include a nickel-cadmium battery, a nickel metal hydride (NiMH) battery, a lithium ion battery, and a lithium polymer battery.

The protection switch 230 may include a charge and discharge switch arranged on a high current path of the battery 210 and controlling a flow of a charging current and a discharging current of the battery 210. The charge and discharge switch may be turned on or off according to a control signal of the battery management system 220. The charge and discharge switch may include a relay or a field-effect transistor (FET) switch. Also, the protection switch 230 may further include a secondary protection device for protecting the battery 210 from over current, over voltage, temperature etc. The secondary protection device may include a relay or a fuse for automatically blocking the high current path when sensing a flow of the over current.

The notifier 240 may display a state of the battery pack 200. The notifier 240 may include at least one of a speaker and an LED, wherein the notifier 240 may display information corresponding to the control signal of the battery management system 220 via the at least one of the speaker and the LED.

The battery management system 220 may monitor and obtain information about the battery 210, such as a current, a voltage, a temperature, etc. of the battery 210. Based on the obtained information, the battery management system 220 may estimate a specific state of the battery 210, such as a voltage of the battery pack 200, a current of the battery pack 200, a charge capacity of the battery 210, whether or not the battery 210 is fully charged, whether or not the battery 210 is overly charged, whether or not an over current occurs, whether or not an over voltage occurs, a degree of deterioration of the battery 210, etc. The battery management system 220 may include all types of devices configured to process data, such as the processor, which may analyze the state of the battery 210 and determine whether it is necessary to protect the battery 210. The battery management system 220 may also transmit and receive information about the state of the battery 210 which is estimated and/or analyzed, to and from an external device, via the CAN communication terminal or the UART communication terminal provided in the battery pack 200. The battery management system 220 may also receive a control signal from the outside and may adjust an offset value. The offset value is a reference for measuring a voltage and a current of the battery pack 200 that is applied by the battery management system 220.

The communication port 110 may include the communication terminals described with reference to FIG. 2, and may include a first port for electrically connecting the battery management system 220 of the battery pack 200 with the controller 140, and a second port for electrically connecting the protection switch 230 and the notifier 240 included in the battery pack 200 with the controller 140.

The first port may provide an electrical connection between the battery management system 220 of the battery pack 200 and the controller 140. The first port forms a path through which the information about the state of the battery 210 (as analyzed by the battery management system 220) is transmitted to the controller 140, and a control signal and a correction signal output from the controller 140 are transmitted to the battery management system 220. The first port may include terminals for any one of a CAN communication method, an RS485 communication method, an RS232 communication method, an RS422 communication method, a UART communication method, and a server message block (SMB) communication method.

The second port may provide an electrical connection between the protection switch 230 and the notifier 240 (which are included in the battery pack 200) and the controller 140. The controller 140 may output control signals for controlling the protection switch 230 and the notifier 240 included in the battery pack 200, respectively, via the second port. For example, when the protection switch 230 and the notifier 240 are electrically connected to the controller 140 via the second port, the controller 140 may output a control signal for turning off the protection switch 230 and/or a control signal for operating the notifier 240. The protection switch 230 is configured to be disconnected and to block a current flow of the battery pack 200, when an abnormality, such as over current, over voltage, and exposure to high temperature, occurs in the battery pack 200. The notifier 240 may include a speaker and/or an LED configured to visually and/or acoustically notify about the abnormality occurring in the battery pack 200.

According to an embodiment, the controller 140 may receive the information about the state of the battery pack 200, the state being analyzed by the battery management system 220, via the communication port 110. The controller 140 may obtain information about a voltage and a current of the battery pack 200, as detected by the battery management system 220, based on the state information. The controller 140 may compare a first measurement value, which corresponds to the voltage and the current of the battery pack 200 obtained based on the state information, with the second measurement value, and may determine whether or not a measurement error in the battery management system 220 is greater than a permissible range.

For example, when the first measurement value is 10 A and the second measurement value is 12 A, the controller 140 may compare the first measurement value with the second measurement value and determine that a measurement error of 2 A occurs in the battery management system 220. In some cases, a permissible error may be around 10%. In this case, because the measurement error is equal to or greater than about 17%, the controller 140 may output the correction signal for correcting the offset value of the battery management system 220 and transmit the correction signal to the battery management system 220. The battery management system 220 may correct the offset value, which is the reference for measuring a current, in response to the correction signal.

According to an embodiment, the controller 140 may output a first control signal, which is a control signal, in response to which the battery management system 220 turns off the protection switch 230. The battery management system 220 may receive the first control signal from the controller 140 via the first port, or the controller 140 may directly transmit a second control signal, which is a control signal for turning off the protection switch 230, to the protection switch 230 via the second port. Similarly, the controller 140 may transmit the first control signal via the first port, in response to which the battery management system 220 operates the notifier 240, or the controller 140 may directly transmit the second control signal, which is a control signal for operating the notifier 240, to the notifier 240 via the second port. The controller 140 may thus diagnose states, that is, whether an abnormality occurs, etc., in the protection switch 230, the notifier 240, and the battery management system 220.

According to an embodiment, the controller 140 may output the first control signal to the battery management system 220 to turn off the protection switch 230. Thereafter, the controller 140 may sense whether a voltage of the battery pack 200 becomes less than a reference voltage (e.g. a preset reference voltage), after outputting the first control signal. Here, whether the voltage of the battery pack 200 becomes less than the reference voltage may be determined based on a voltage applied to both ends of the battery pack 200 when the protection switch 230 is turned off (e.g., the charging and discharging of the battery 210 are stopped). When the voltage of the battery pack 200 is equal to or greater than the reference voltage, the controller 140 may determine that an abnormality has occurred in any one of the battery management system 220 and the protection switch 230.

In this case, the controller 140 may output, via the second port, the second control signal for directly turning off the protection switch 230. Likewise, the controller 140 may sense whether a voltage of the battery pack 200 becomes less than the reference voltage, after outputting the second control signal. When the voltage of the battery pack 200 continues to be equal to or greater than the reference voltage, the controller 140 may diagnose that an abnormality, such as a malfunction, a breakdown, etc., has occurred in the protection switch 230, rather than the battery management system 220. In contrast, when the voltage of the battery pack 200 becomes less than the reference voltage, the controller 140 may diagnose that an abnormality, such as a malfunction, a breakdown, etc., has occurred in the battery management system 220.

According to an embodiment, the controller 140 may compare a first measurement value with a second measurement value. The first measurement value corresponds to a magnitude of a voltage and/or a current of the battery pack 200, the magnitude being determined by the battery management system 220. The second measurement value corresponds to a magnitude of a voltage and/or a current of the battery pack 200, the magnitude being measured by the measurer 130. The controller 140 may calculate an error rate of the first measurement value based on the second measurement value.

For example, the battery pack diagnostic apparatus 100 may calculate a difference value between the second measurement value and the first measurement value. The battery pack diagnostic apparatus 100 may calculate the error rate by dividing the difference value by the first measurement value. Meanwhile, the second measurement value may be a value measured at a time point corresponding to a time point in which the first measurement value is calculated (e.g., the first and second measurement values may be taken at the same time).

When the error rate is greater than a reference value (e.g., a preset reference value), the controller 140 may output the correction signal. The controller 140 may output the correction signal to correct an offset value of the battery management system 220 to drive the first measurement value that corresponds to the second measurement value. Here, the reference value may be set by taking into account a permissible error range with respect to measurement of an output voltage and an output current of the battery management system 220, or may be set as a certain value by a user in advance. Meanwhile, when the error rate of the first measurement value continues to be greater than the reference value after outputting the correction signal, the controller 140 may determine that a hardware error or a hardware breakdown has occurred in the battery management system 220.

According to an embodiment, the controller 140 may adjust the offset value of the battery management system 220 by outputting the correction signal to the battery management system 220. The offset value of the battery management system 220 may denote a reference value for calculating a magnitude of a voltage and a current of the battery 210 based on sensing information with respect to the battery, which is measured by sensors. When the battery management system 220 detects the magnitude of the current of the battery 210, which is measured by a comparator, a reference value of the comparator may be the offset value.

According to an embodiment, the controller 140 may generate a signal to activate the battery pack. For example, the controller 140 may generate a wake-up signal based on a user input and may transmit the generated wake-up signal to the battery pack 200 via a communication terminal. The wake-up signal may be a signal for operating the battery pack 200 (or a driving signal of the battery management system 220 for turning on the battery pack 200). The battery management system 220 may receive a control signal from the battery pack diagnostic apparatus 100 and may initially be in a pause state in which the battery management system 220 does not operate and therefore may not generate the state information about the battery pack 200. Thus, before diagnosing the battery pack 200, the controller 140 may output the wake-up signal to the battery management system 220 to drive the battery management system 220, and then, may start to diagnose the state of the battery pack 200 based on the state information of the battery management system 220 and the voltage and the current of the battery pack 200.

Meanwhile, the user may provide a user input to the controller 140, via a switch provided in the battery pack diagnostic apparatus 100. Here, the switch may be any one of a toggle switch, a selector switch, a push button switch, a slide switch, and a tumbler switch. However, it is an example, and the present disclosure is not limited thereto.

According to an embodiment, the controller 140 may control the display 150 to display an abnormal state of the battery management system 220, the notifier 240, and/or a first switch of the battery pack 200. The controller 140 may display the abnormal state described above via the display 150 to notify the user or an inspector about a portion of the battery pack 200, in which the abnormality occurs. Also, the controller 140 may wirelessly transmit the diagnosed state information to a terminal of the user via the communicator 160.

Figure 4:
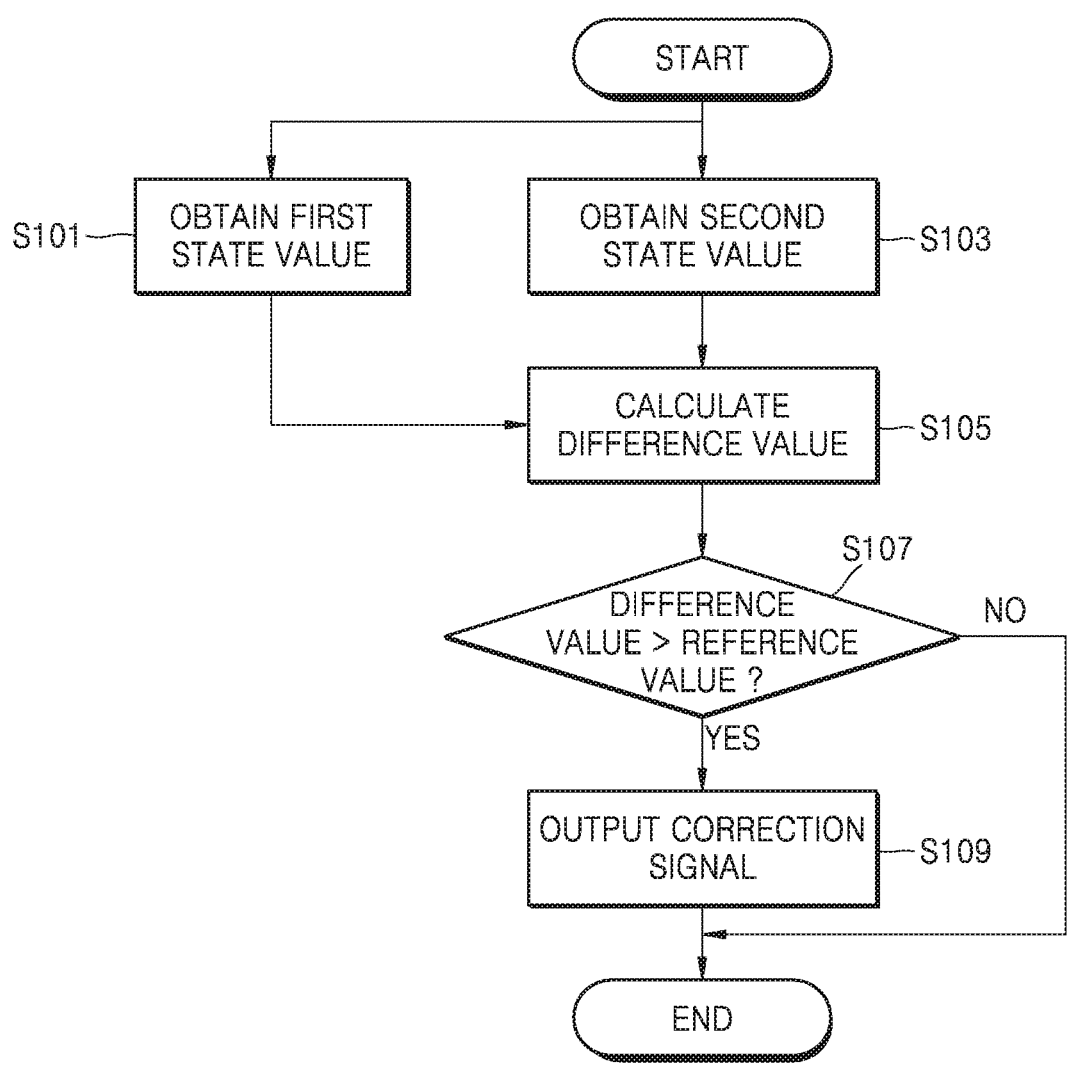
FIG. 4 is a flowchart of a method of outputting a correction signal via a battery pack diagnostic apparatus, according to an embodiment.

FIG. 4 is a flowchart of a method of outputting a correction signal via the battery pack diagnostic apparatus 100, according to an embodiment.

The flowchart illustrated in FIG. 4 may include the operations sequentially performed by the battery pack diagnostic apparatus 100 illustrated in FIG. 2. Thus, it will be understood that although omitted hereinafter, the aspects described above with respect to the components illustrated in FIG. 2 may be applied to the flowchart illustrated in FIG. 4.

Referring to FIG. 4, the battery pack diagnostic apparatus 100 may be electrically connected to the battery pack 200 (refer to FIG. 1A) and may receive the state information of the battery 210 (refer to FIG. 3) and the battery pack 200 (refer to FIG. 1A) from the battery management system 220 (refer to FIG. 3) of the battery pack 200 (refer to FIG. 1A). The battery pack diagnostic apparatus 100 may obtain a magnitude of a voltage and a current of the battery pack 200 (refer to FIG. 1A), the magnitude being measured by the battery management system 220 (refer to FIG. 3), as a first measurement value, based on the received state information. For example, when the battery management system 220 (refer to FIG. 3) measures the magnitude of the voltage of the battery pack 200 (refer to FIG. 1A) as 10V, the battery pack diagnostic apparatus 100 may receive the state information, which corresponds to the value of the voltage measured by the battery management system 220 (refer to FIG. 3), and obtain the first measurement value of 10V.

The battery pack diagnostic apparatus 100 may be connected to an output terminal (201 and 202) provided in the battery pack 200 (refer to FIG. 1A) and may directly measure at least one of the voltage and the current of the battery pack 200 (refer to FIG. 1A) (S101). The battery pack diagnostic apparatus 100 may obtain the voltage and the current directly measured by the battery pack diagnostic apparatus 100 as a second measurement value, separately from the first measurement value (S103).

The battery pack diagnostic apparatus 100 may calculate an error rate of the first measurement value based on the second measurement value (S105). For example, the battery pack diagnostic apparatus 100 may calculate a difference value between the second measurement value and the first measurement value. The battery pack diagnostic apparatus 100 may calculate the error rate by dividing the difference value by the first measurement value. Meanwhile, the second measurement value may be a value measured at a time point corresponding to a time point in which the first measurement value is calculated.

When the error rate is greater than a reference value, the battery pack diagnostic apparatus 100 may diagnose that it is necessary to correct an offset value, which is a reference for measurement of current and voltage of the battery management system 220 (refer to FIG. 3) (S107). The battery pack diagnostic apparatus 100 may output a correction signal for correcting the offset value of the battery management system 220, so that the first measurement value has a value corresponding to a value of the second measurement value (S109). The offset value of the battery management system 220 may be adjusted based on the correction signal.

In contrast, when the error rate is equal to or less than the reference value, the battery pack diagnostic apparatus 100 may determine that the offset value of the battery management system 220 is acceptable (e.g., normal).

Meanwhile, the battery pack diagnostic apparatus 100 may periodically receive the first measurement value and the second measurement value and determine whether the error rate becomes equal to or less than the reference value. When the error rate of the first measurement value based on the second measurement value continues to be greater than the reference value, the battery pack diagnostic apparatus 100 may diagnose that a hardware issue has occurred or is occurring in the battery management system 220.

According to the one or more of the embodiments described above, via the battery pack diagnostic apparatus 100, a user may quickly and easily identify a state of the battery pack 200 at a site in which the battery pack 200 is installed and/or used, and may correct an error of an output voltage and an output current of the battery pack 200, the output voltage and the output current being measured by the battery management system 220 included in the battery pack 200.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims and their equivalents.

What is claimed is:

1. A battery pack diagnostic apparatus for diagnosing a battery pack comprising a battery and a battery management system, the battery pack diagnostic apparatus comprising:

a communication port configured to provide an electrical connection between the battery pack diagnostic apparatus and the battery management system;

a measurer electrically connected to an output terminal of the battery pack and configured to measure a voltage and a current of the battery pack; and a controller configured to obtain a first measurement value with respect to a first voltage and a first current of the battery pack analyzed by the battery management system, wherein the first voltage and the first current are received from the battery management system over the communication port, to obtain a second measurement value with respect to a second voltage and a second current of the battery pack, wherein the second voltage and the second current correspond to the voltage and the current of the battery pack measured by the measurer, and to analyze a state of the battery pack based on the first measurement value and the second measurement value.

2. The battery pack diagnostic apparatus of claim 1, wherein the controller is further configured to calculate an error rate of the first measurement value based on the second measurement value, and when the calculated error rate is greater than a reference value, output a correction signal to the battery management system via the communication port.

3. The battery pack diagnostic apparatus of claim 2, wherein the correction signal is a signal for correcting an offset value with respect to measurements of voltage and current by the battery management system.

4. The battery pack diagnostic apparatus of claim 1, wherein the communication port comprises a plurality of terminals for controller area network (CAN) communication and universal asynchronous receiver/transmitter (UART) communication, and the controller is further configured to analyze a protocol, a voltage level, and noise of the plurality of terminals and diagnose abnormalities of the plurality of terminals.

5. The battery pack diagnostic apparatus of claim 1, wherein the communication port comprises a first port for electrically connecting the battery pack diagnostic apparatus and the battery management system and a second port for electrically connecting the battery pack diagnostic apparatus and at least one of a protection switch and a notifier, the protection switch and the notifier being in the battery pack, and the controller is further configured to output, via the second port, a control signal for turning off the protection switch and a control signal for operating the notifier.

6. The battery pack diagnostic apparatus of claim 5, wherein the controller is further configured to output via the first port a first control signal to allow the battery management system to turn off the protection switch and to output via the second port a second control signal to turn off the protection switch and the notifier.

7. The battery pack diagnostic apparatus of claim 6, wherein the controller is further configured to sequentially output the first control signal and the second control signal and to diagnose states of the battery management system, the protection switch, and the notifier.

8. The battery pack diagnostic apparatus of claim 1, further comprising a display, configured to display state information of the battery pack under control of the controller.

9. The battery pack diagnostic apparatus of claim 1, wherein the controller is further configured to activate the battery pack.

10. The battery pack diagnostic apparatus of claim 9, wherein the controller is configured to activate the battery pack by generating a wake-up signal for operating the battery pack and outputting the generated wake-up signal through the communication port to operate the battery pack.

11. The battery pack diagnostic apparatus of claim 1, wherein the controller is configured to communicate diagnostic status information of the battery pack to a mobile device.

* * * * *